(12) United States Patent
Choi et al.

(10) Patent No.: US 10,985,091 B2
(45) Date of Patent: Apr. 20, 2021

(54) SEMICONDUCTOR PACKAGE

(71) Applicant: SAMSUNG ELECTRONICS CO., LTD., Suwon-si (KR)

(72) Inventors: Daeyeun Choi, Suwon-si (KR); Jaemok Jung, Suwon-si (KR); Eunjin Kim, Suwon-si (KR); Chilwoo Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/691,910

(22) Filed: Nov. 22, 2019

(65) Prior Publication Data
US 2020/0194348 A1  Jun. 18, 2020

(30) Foreign Application Priority Data
Dec. 18, 2018  (KR) .................. 10-2018-0164029

(51) Int. Cl.
*H01L 23/495* (2006.01)
*H01L 23/28* (2006.01)
*H01L 23/522* (2006.01)

(52) U.S. Cl.
CPC ........ *H01L 23/49541* (2013.01); *H01L 23/28* (2013.01); *H01L 23/49575* (2013.01); *H01L 23/5226* (2013.01); *H01L 2924/15173* (2013.01)

(58) Field of Classification Search
CPC .............. H01L 23/49541; H01L 23/28; H01L 23/49575; H01L 23/5226; H01L 2924/15173

USPC ......................................................... 257/676
See application file for complete search history.

(56) References Cited

U.S. PATENT DOCUMENTS 6,303,871 B1   10/2001  Zu et al.
10,026,715 B2*  7/2018  Kume ................. H01L 25/0657
2019/0019757 A1  1/2019  Lee et al.

FOREIGN PATENT DOCUMENTS

KR   10-2017-0093452 A   8/2017
KR     10-1883108 B1     7/2018

* cited by examiner

*Primary Examiner* — Tu-Tu V Ho
(74) *Attorney, Agent, or Firm* — Sughrue Mion, PLLC

(57) ABSTRACT

This invention provides a semiconductor package, the semiconductor package includes: a semiconductor chip having a connection pad; an encapsulant covering at least a portion of the semiconductor chip; and a connection structure disposed on the semiconductor chip and the encapsulant. The connection structure comprises a first insulation layer, a first redistribution layer disposed on the first insulation layer, and a second insulation layer disposed on the first insulation layer and covering the first redistribution layer. The first redistribution layer has one or more openings. The openings have a shape having a plurality of protrusions, respectively, and B/A is 1.5 or less, where A refers to a thickness of the first redistribution layer, and B refers to a thickness of a region of the second insulation layer covering the first redistribution layer.

20 Claims, 12 Drawing Sheets

I-I'

SEMICONDUCTOR PACKAGE

CROSS-REFERENCE TO RELATED APPLICATION

This application claims benefit of priority to Korean Patent Application No. 10-2018-0164029 filed on Dec. 18, 2018 in the Korean Intellectual Property Office, the disclosure of which is incorporated herein by reference in its entirety.

BACKGROUND

The present disclosure relates to a semiconductor package, e.g., a fan-out semiconductor package.

One of main trends in technological development related to semiconductor chips in recent years is to reduce the size of components. Therefore, in the field of packaging, it is necessary to implement a large number of pins while having a small size in accordance with a surge in demand for small semiconductor chips and the like. To meet this requirement, one proposed semiconductor package technology is a fan-out semiconductor package. The fan-out semiconductor package may redistribute an electrical connection structure beyond an area on which a semiconductor chip is disposed, thereby enabling a large number of pins to be implemented while maintaining a small size.

Meanwhile, in a vacuum lamination method used in the printed circuit board manufacturing process, since an insulation layer may be transferred to a substrate through the vacuum lamination method to form an insulation layer, it is possible to effectively cope with the thickness deviation by position. However, there may be defects due to foreign matter generated during a film cutting process, and there maybe a high possibility of void occurrence due to insufficient filling of the insulation layer. In particular, since this film type insulation layer may usually be a non-photosensitive insulation layer, there may be a limit to the fine pitch of the redistribution layer and the connection via. In the field of semiconductor packaging technology in which a fine design is required, a method of coating a liquid insulating material on a substrate may be generally applied as a process of forming an insulation layer for forming a redistribution layer.

SUMMARY

An aspect of the present disclosure is to provide a semiconductor package capable of sufficiently controlling undulation even when forming an opening in a redistribution layer.

One of various solutions proposed through the present disclosure is that in forming the connection structure corresponding to a redistribution region, an opening having a plurality of protrusions are formed in a redistribution layer under a condition that specific relationship between a thickness of a redistribution layer and a thickness of an insulation layer is satisfied.

According to an aspect of the present disclosure, a semiconductor package includes: a semiconductor chip having a connection pad; an encapsulant covering at least a portion of the semiconductor chip; and a connection structure disposed on the semiconductor chip and the encapsulant. The connection structure comprises a first insulation layer, a first redistribution layer disposed on the first insulation layer, and a second insulation layer disposed on the first insulation layer and covering the first redistribution layer. The first redistribution layer has one or more openings. The openings have a shape having a plurality of protrusions, respectively, and B/A is 1.5 or less, where A refers to a thickness of the first redistribution layer, and B refers to a thickness of a region of the second insulation layer covering the first redistribution layer.

According to another aspect of the present disclosure, a semiconductor package includes: a semiconductor chip having a connection pad; an encapsulant covering at least a portion of the semiconductor chip; and a connection structure disposed on the semiconductor chip and the encapsulant. The connection structure comprises a first insulation layer, a first redistribution layer disposed on the first insulation layer, and a second insulation layer disposed on the first insulation layer and covering the first redistribution layer. The first redistribution layer has a plurality of openings each having a cross shape, and a thickness of the first redistribution layer is 10 µm or less.

According to another aspect of the present disclosure, a semiconductor package includes: a semiconductor chip having a connection pad; an encapsulant covering at least a portion of the semiconductor chip; and a connection structure disposed on the semiconductor chip and the encapsulant. The connection structure comprises a first insulation layer, a first redistribution layer disposed on the first insulation layer, a second insulation layer disposed on the first insulation layer and covering the first redistribution layer, and a second redistribution layer disposed on the second insulation layer. The first redistribution layer has a plurality of first openings each having a cross shape, the second redistribution layer has a plurality of second openings each having a cross shape, and in a plan view, the plurality of first openings and the plurality of second openings are spaced apart from each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
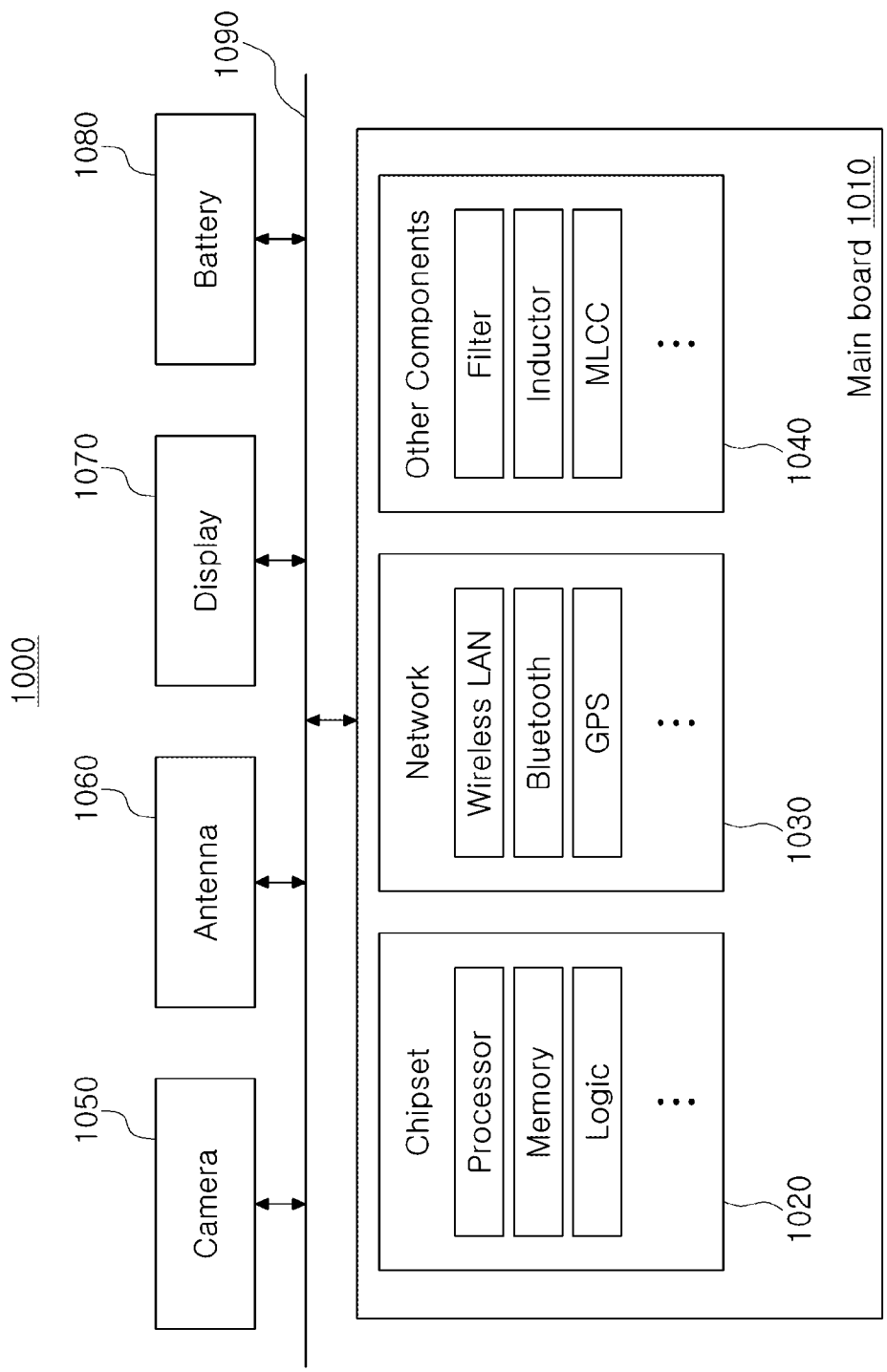
FIG. 1 is a schematic block diagram illustrating an example of an electronic device system.

FIG. 1 is a block diagram schematically illustrating an exemplary embodiment of an electronic device system.

Referring to the drawings, an electronic device 1000 may include a main board 1010. The main board 1010 may be physically and/or electrically connected to chip-related components 1020, network-related components 1030, and other components 1040. They may be also combined with other components to be described later by various signal lines 1090.

The chip-related components 1020 may include a memory chip, such as a volatile memory (e.g., DRAM), a non-volatile memory (e.g., ROM), a flash memory, etc.; an application processor chip, such as a central processor (e.g., CPU), a graphics processor (e.g., GPU), a digital signal processor, a cryptographic processor, a microprocessor, a microcontroller, etc.; a logic chip, such as an analog-to-digital converter, an application-specific IC (ASICs), but are not limited thereto, and other types of chip-related components may be included. These components 1020 may be combined with each other.

The network-related components 1030 may include components operated according to protocols such as Wi-Fi (IEEE 802.11 family, etc.), WiMAX (IEEE 802.16 family, etc.), IEEE 802.20, long term evolution LTE, Ev-DO, HSPA+, HSDPA+, HSUPA+, EDGE, GSM, GPS, GPRS, CDMA, TDMA, DECT, Bluetooth, 3G protocol, 4G protocol, 5G protocol, and any other wireless and wired protocols designated after the abovementioned protocols, but are not limited thereto, components operated according to and any of other various wireless or wired standards or protocols may be further included. The network-related components 1030 may be combined with the chip-related components 1020, as well.

Other components 1040 may include a high frequency inductor, a ferrite inductor, a power inductor, a ferrite bead, a low temperature co-firing ceramic (LTCC), an electromagnetic interference (EMI) filter, and a multilayer ceramic condenser (MLCC), but is not limited thereto, and may include other passive components used for various other purposes. Other components 1040 may be combined with each other, in addition to the chip-related components 1020 and/or the network-related components 1030.

Depending on the type of the electronic device 1000, the electronic device 1000 may include other components that may or may not be physically and/or electrically connected to the main board 1010. Other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (e.g., a hard disk drive) (not illustrated), a compact disk (CD) driver (not illustrated), and a digital versatile disk (DVD) driver (not illustrated), and the like, but is not limited thereto, and other components used for various purposes may be included, depending on the type of the electronic device 1000.

The electronic device 1000 may be a smartphone, a personal digital assistant, a digital video camera, a digital still camera, a network system, a computer, a monitor, a tablet computer, a laptop computer, a netbook, a television, a video game machine, a smartwatch, an automotive component, and the like, but is not limited thereto, and may be any other electronic device that processes data.

Figure 2:
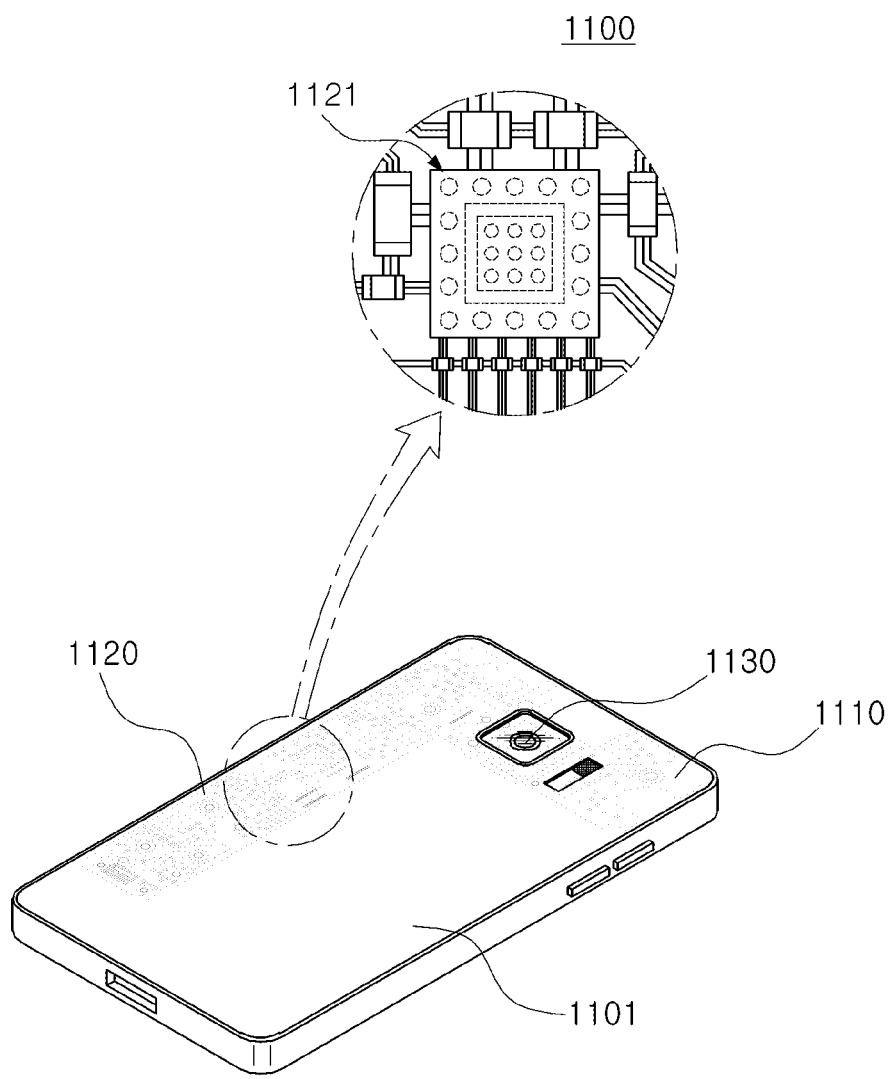
FIG. 2 is a schematic perspective view illustrating an example of an electronic device.

FIG. 2 is a perspective view schematically illustrating an exemplary embodiment of an electronic device.

Referring to the drawings, a semiconductor package may be applied to various electronic devices as described above for various purposes. For example, a printed circuit board 1110, such as a main board, may be included in a body 1101 of a smartphone 1100. Further, various components 1120 may be physically and/or electrically connected to the printed circuit board 1110. In addition, other components that may or may not be physically and/or electrically connected to the printed circuit board 1110, such as a camera 1130, may be housed within the body 1101. A portion of the components 1120 may be chip-related components, for example, but not limited to, a semiconductor package 1121. The electronic device is not necessarily limited to the smartphone 1100, and may be other electronic device as described above.

Semiconductor Package

In general, a semiconductor chip may have many microelectronic circuits integrated therein, but does not necessarily serve as a finished product of a semiconductor in itself, and the semiconductor chip may be damaged by an external physical or chemical impact. Therefore, the semiconductor chip itself may be not used as it is and may be packaged and used in an electronic device or the like in such a packaged state.

Semiconductor packaging may be necessary, since there may be a difference in a circuit width between a semiconductor chip and a main board of the electronic device in view of an electrical connection. Specifically, for a semiconductor chip, the size of the connection pad and the interval between connection pads are very small and narrow, whereas the size of the component mounting pad and the interval between component mounting pads are much larger and wider than the scale of the semiconductor chip, respectively. Therefore, since it is difficult to directly mount a semiconductor chip on such a main board, there is a need for a packaging technique which may buffer the difference in a circuit width therebetween.

A semiconductor package manufactured by such a packaging technique may be classified as a fan-in semiconductor package and a fan-out semiconductor package, depending on the structure and use thereof.

Hereinafter, the fan-in semiconductor package and the fan-out semiconductor package will be described in more detail with reference to the drawings.

Fan-In Semiconductor Package

Figure 3A:
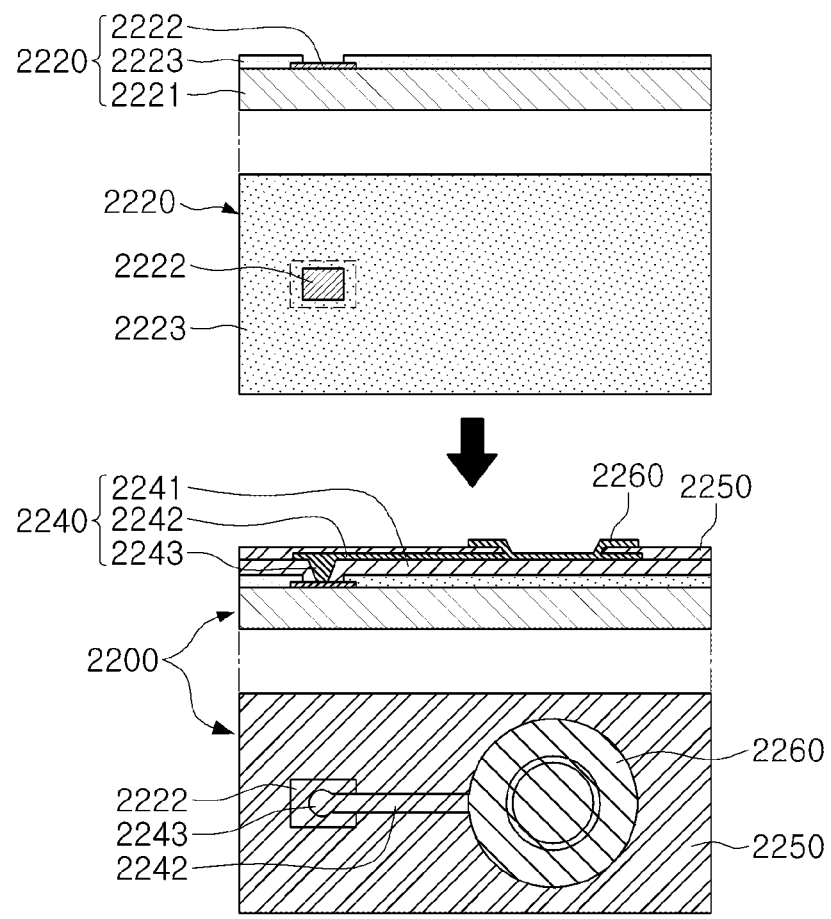
FIGS. 3A and 3B are schematic cross-sectional views illustrating states of a fan-in semiconductor package before and after being packaged.
Figure 3B:
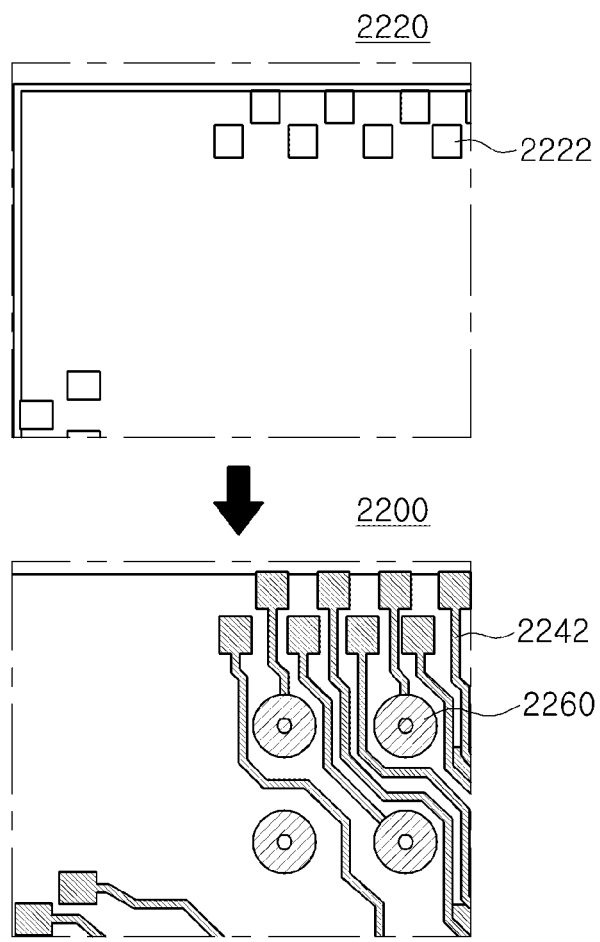

FIGS. 3A and 3B are cross-sectional views schematically illustrating states of a fan-in semiconductor package, before and after packaging thereof.

Figure 4:
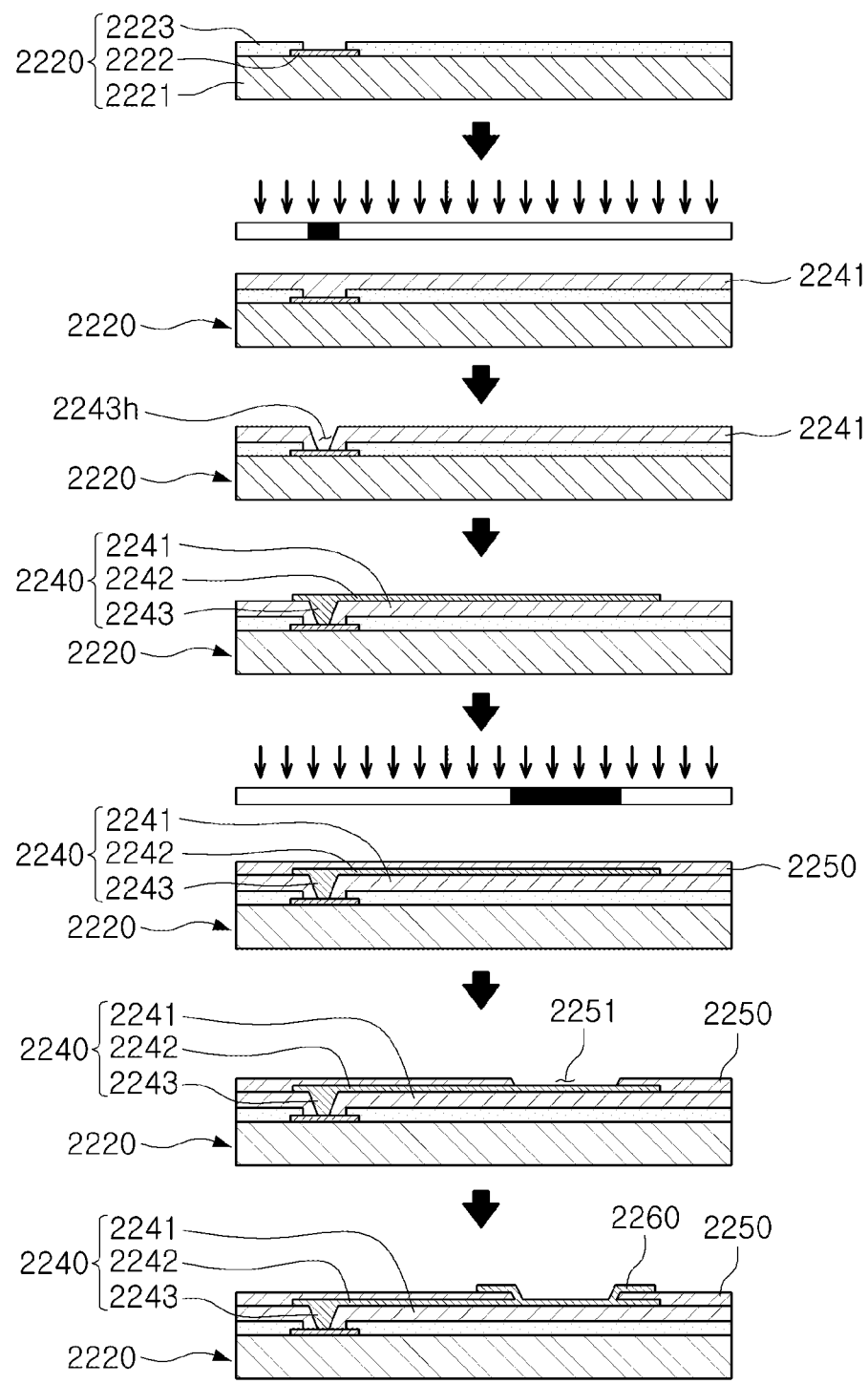
FIG. 4 is schematic cross-sectional views illustrating a packaging process of a fan-in semiconductor package.

FIG. 4 is a cross-sectional view schematically illustrating a packaging process of a fan-in semiconductor package.

Referring to the drawings, a semiconductor chip 2220 may be an integrated circuit (IC) in a bare state. A body 2221 may include silicon (Si), germanium (Ge), gallium arsenide (GaAs), or the like. A connection pad 2222 may include a conductive material, such as aluminum (Al) or the like, formed on one surface of the body 2221. A passivation film 2223, such as an oxide film, a nitride film, or the like, may be formed on one surface of the body 2221 and cover at least a portion of the connection pad 2222. At this time, since the connection pad 2222 is very small, it may be difficult to mount the integrated circuit (IC) even on a medium-size level printed circuit board (PCB) as well as a main board of the electronic device.

A connection structure 2240 may be formed on the semiconductor chip 2220 in conformity with the size of the semiconductor chip 2220, to redistribute the connection pad 2222. The connection structure 2240 may be prepared by way of forming an insulation layer 2241 with an insulating material such as a photo-imageable dielectric resin on the semiconductor chip 2220, forming a via hole 2243h for opening the connection pad 2222, and forming a wiring pattern 2242 and a via 2243. Thereafter, a passivation layer 2250 for protecting the connection structure 2240 may be formed, an opening 2251 may be formed, and an under-bump metal layer 2260 or the like may be formed. For example, a fan-in semiconductor package 2200 including, for example, the semiconductor chip 2220, the connection structure 2240, the passivation layer 2250, and the under-bump metal layer 2260 may be formed through a series of processes.

As described above, the fan-in semiconductor package may be a package type in which all the connection pads of the semiconductor chip, for example, input/output (I/O) terminals are arranged inside the element. The fan-in semiconductor package may have good electrical characteristics, and may be produced at relatively low cost. Accordingly, many elements in a smartphone may be manufactured in the form of a fan-in semiconductor package. Specifically, it is being developed in a direction of achieving a small-sized form and realizing fast signal transmission at the same time.

Since, in the fan-in semiconductor package, all of the I/O terminals should be disposed inside the semiconductor chip, there may be many limitations in space. Therefore, such a structure may be difficult to apply to a semiconductor chip having a large number of I/O terminals or a semiconductor chip having a small size. In addition, due to this problem, the fan-in semiconductor package may not be directly mounted on and used in a main board of an electronic device. Even when the size and interval of the I/O terminals of the semiconductor chip are enlarged in a redistributing process, they do not have a size and an interval enough to be directly mounted on the main board of the electronic device.

Figure 5:
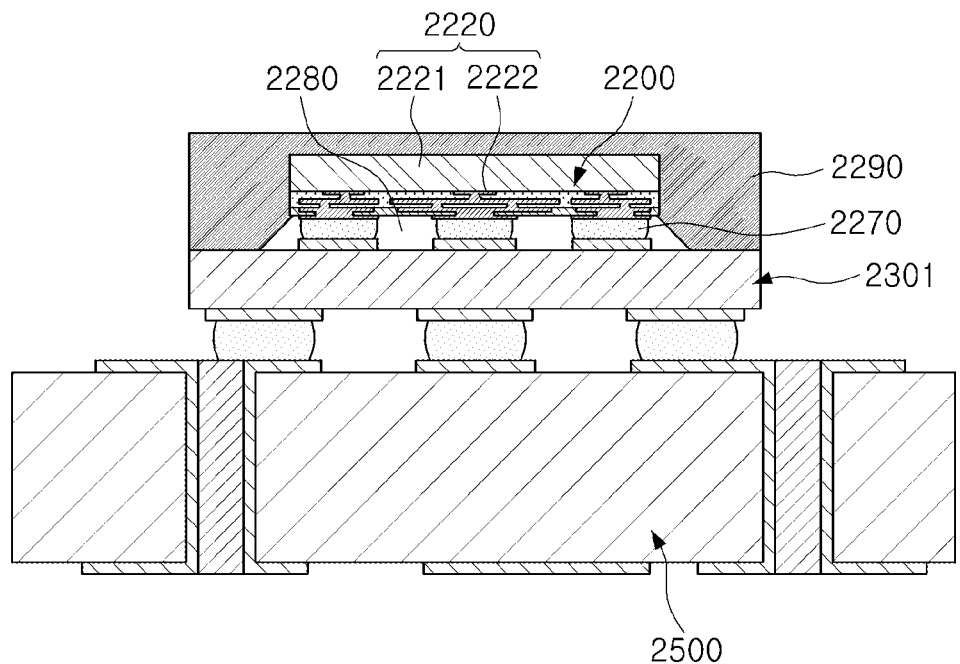
FIG. 5 is a schematic cross-sectional view illustrating a case in which a fan-in semiconductor package is mounted on a printed circuit board and is ultimately mounted on a mainboard of an electronic device.

FIG. 5 is a cross-sectional view schematically illustrating a fan-in semiconductor package mounted on a printed circuit board and is ultimately mounted on a main board of an electronic device.

Figure 6:
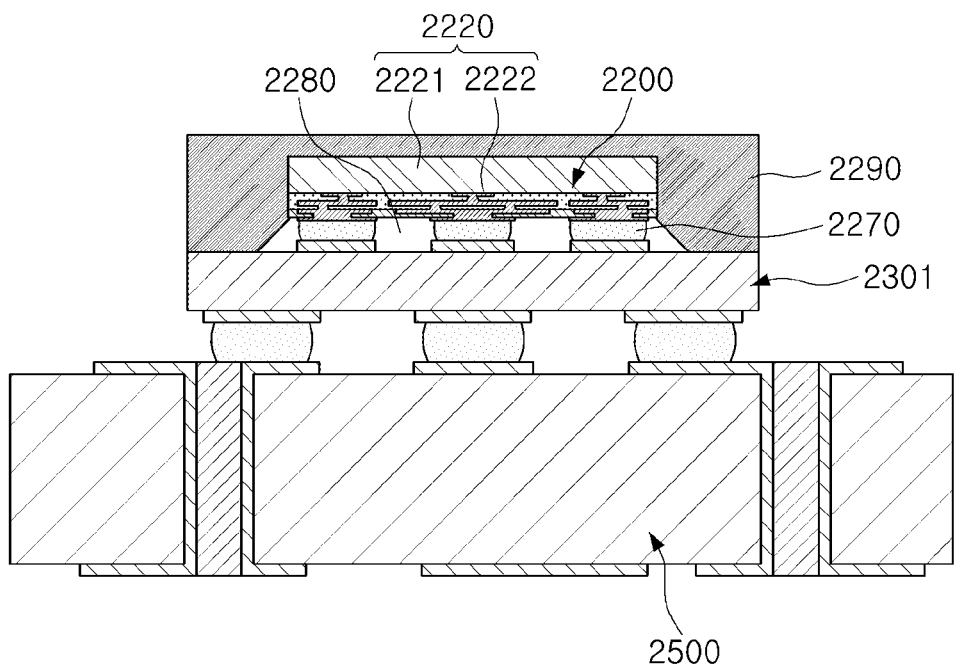
FIG. 6 is a schematic cross-sectional view illustrating a case in which a fan-in semiconductor package is embedded in a printed circuit board and is ultimately mounted on a mainboard of an electronic device.

FIG. 6 is a cross-sectional view schematically illustrating a fan-in semiconductor package embedded in a printed circuit board and is ultimately mounted on a main board of an electronic device.

Referring to the drawings, a fan-in semiconductor package 2200 may be configured such that connection pads 2222 of a semiconductor chip 2220, i.e. I/O terminals are redistributed once again through a printed circuit board 2301, and the fan-in semiconductor package 2200 mounted on the printed circuit board 2301 is mounted on a main board 2500 of an electronic device. At this time, a solder ball 2270 and the like may be fixed with an underfill resin 2280, and an outer side thereof may be covered with a molding material 2290 or the like. Alternatively, the fan-in semiconductor package 2200 may be embedded in a separate printed circuit board 2302, and the connection pads 2222 of the semiconductor chip 2220, i.e., the I/O terminals may be redistributed once again in an embedded form, and ultimately mounted on the main board 2500 of the electronic device.

As above, it may be difficult to directly mount the fan-in semiconductor package on the main board of the electronic device. Therefore, it may be mounted on a separate printed circuit board, and may be then mounted on the main board of the electronic device through a packaging process, or may be mounted on the main board of the electronic device in a form embedded in the printed circuit board.

Fan-Out Semiconductor Package

Figure 7:
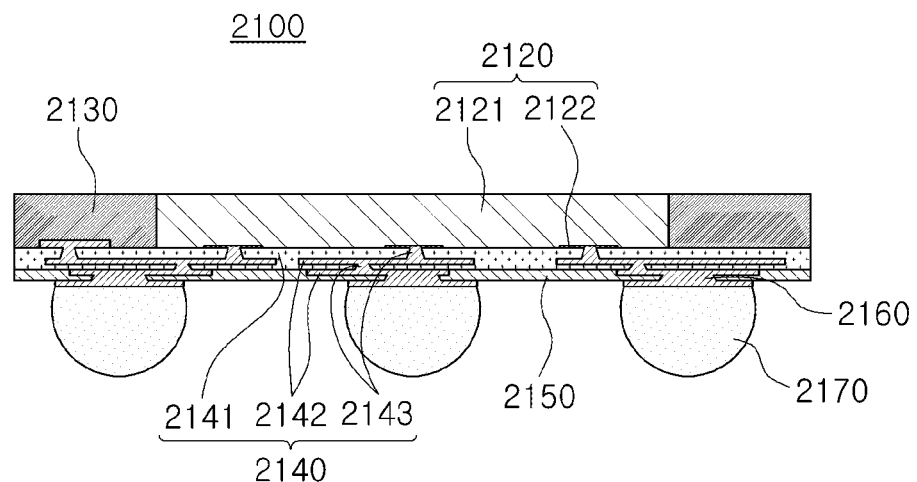
FIG. 7 is a schematic cross-sectional view illustrating a fan-out semiconductor package.

FIG. 7 is a cross-sectional view schematically illustrating a fan-out semiconductor package.

Referring to the drawings, in a fan-out semiconductor package 2100, for example, an outer side of a semiconductor chip 2120 may be protected by an encapsulant 2130, and connection pads 2122 of the semiconductor chip 2120 may be redistributed to the outer side of the semiconductor chip 2120 through a connection structure 2140. A passivation layer 2150 may be further formed on the connection structure 2140. An under-bump metal layer 2160 may be further formed on an opening of the passivation layer 2150. A solder ball 2170 may be further formed on the under-bump metal layer 2160. The semiconductor chip 2120 may be an integrated circuit (IC) including a body 2121, a connection pad 2122, and the like. The connection structure 2140 may include an insulation layer 2141, a wiring layer 2142 formed on the insulation layer 2241, and a via 2143 for electrically connecting the connection pad 2122 and the wiring layer 2142.

The fan-out semiconductor package may be formed by redistributing the I/O terminals to the outer side of the semiconductor chip through the connection structure formed on the semiconductor chip. As described above, in a fan-in semiconductor package, all of the I/O terminals of the semiconductor chip should be disposed inside of the semiconductor chip. When the size of the element is reduced, the size and pitch of the ball should be reduced. Therefore, the standardized ball layout maybe not used. On the other hand, in a fan-out semiconductor package, the I/O terminals may be redistributed outward from the semiconductor chip through the connection structure formed on the semiconductor chip. Although the size of the semiconductor chip is reduced, the standardized ball layout may be used as it is. Therefore, the fan-out semiconductor package may be mounted on a main board of an electronic device without a separate printed circuit board, as described later.

Figure 8:
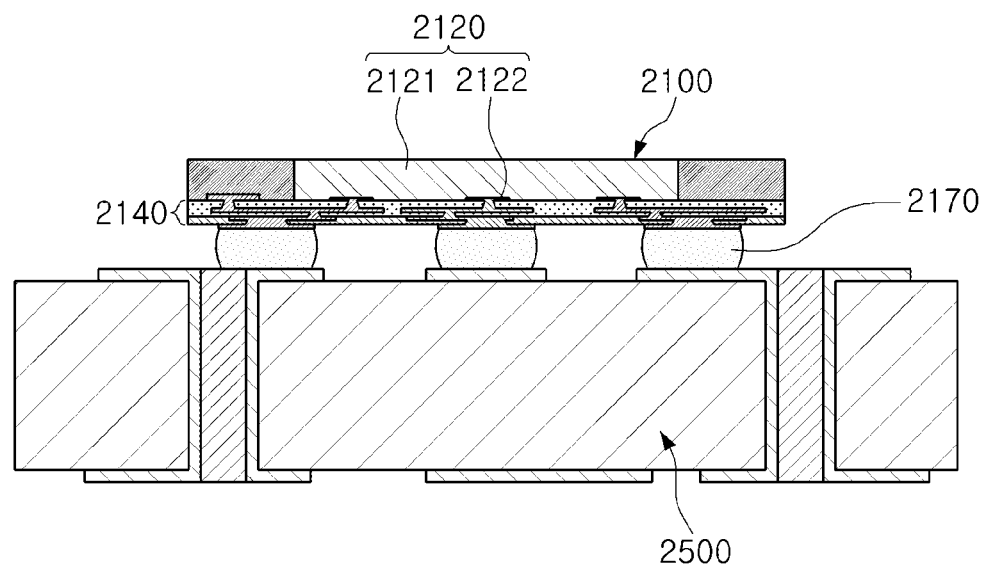
FIG. 8 is a schematic cross-sectional view illustrating a case in which a fan-out semiconductor package is mounted on a mainboard of an electronic device.

FIG. 8 is a cross-sectional view schematically illustrating a fan-out semiconductor package mounted on a main board of an electronic device.

Referring to the drawings, a fan-out semiconductor package 2100 may be mounted on a main board 2500 of an electronic device through a solder ball 2170 or the like. For example, as described above, the fan-out semiconductor package 2100 may include a connection structure 2410 on the semiconductor chip 2120 that may redistribute connection pads 2122 to a fan-out area beyond a size of the semiconductor chip 2120. The standardized ball layout may be used as it is, and as a result, it may be mounted on the main board 2500 of the electronic device without a separate printed circuit board or the like.

Since the fan-out semiconductor package may be mounted on the main board of the electronic device without a separate printed circuit board, as above, the fan-out semiconductor package may be made thinner than the fan-in semiconductor package using the printed circuit board. Therefore, a downsizing and thinning in the fan-out semiconductor package maybe accomplished. It may be also suitable for mobile products because of its excellent thermal and electrical properties. In addition, it may be implemented more compactly than a general package-on-package (POP) type using a printed circuit board (PCB), and a problem caused by a bending phenomenon may be prevented.

The fan-out semiconductor package may refer to a package technology for mounting the semiconductor chip on a main board of the electronic device, or the like, and for protecting the semiconductor chip from an external impact, and may have a concept different from those of a printed circuit board (PCB), such as a printed circuit board in which a fan-in semiconductor package is embedded, which are different from each other in view of scale, use, and the like.

Hereinafter, a semiconductor package having a novel structure, which significantly reduces a mounting area of a semiconductor chip and a passive component, significantly reduces an electrical path between a semiconductor chip and a passive component, significantly reduces process defects such as undulations and cracks, and, furthermore, easily connects electrodes of passive components to connection vias by a laser-via process or the like, may be described with reference to the drawings.

Figure 9:
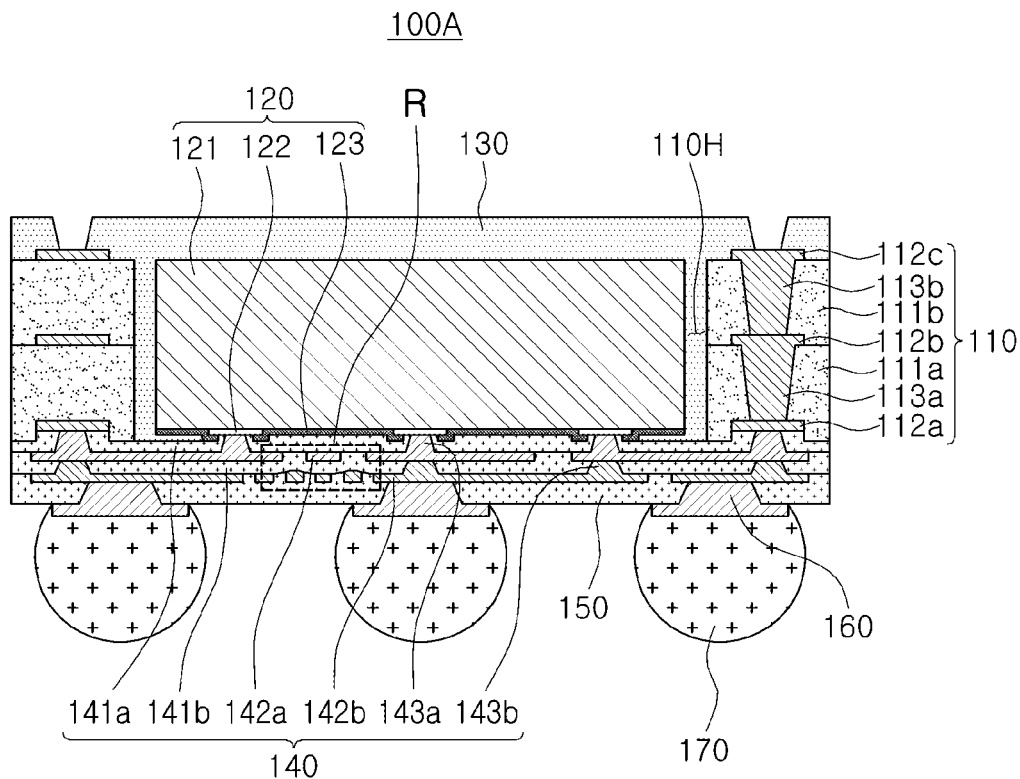
FIG. 9 is a schematic cross-sectional view illustrating an example of a semiconductor package.

FIG. 9 is a schematic cross-sectional view illustrating an example of a semiconductor package.

Figure 10:
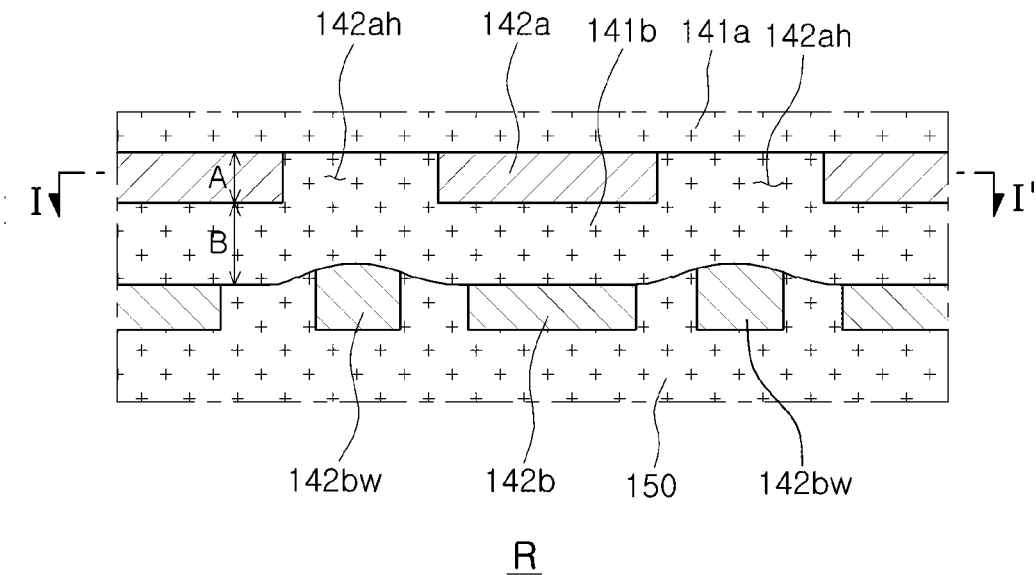
FIG. 10 is an enlarged cross-sectional view schematically illustrating region R in FIG. 9.

FIG. 10 is an enlarged cross-sectional view schematically illustrating region R in FIG. 9.

Figure 11:
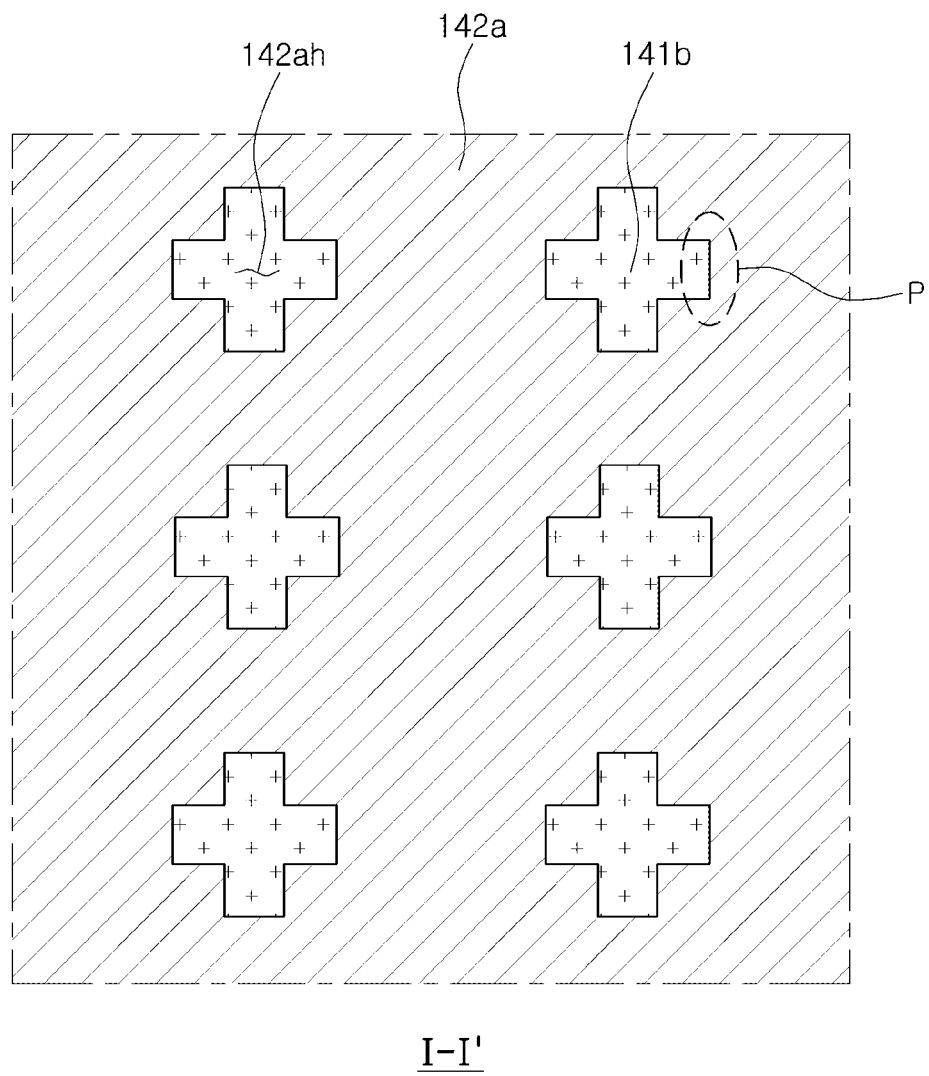
FIG. 11 is a schematic plan view of region I-I' of region R in FIG. 10.

FIG. 11 is a schematic plan view of region I-I' of region R in FIG. 10.

A semiconductor package 100A according to an example may include a semiconductor chip 120 having a connection pad 122, an encapsulant 130 covering at least a portion of the semiconductor chip 120, and a connection structure 140 disposed on the semiconductor chip 120 and the encapsulant 130. The connection structure 140 may include a first insulation layer 141a, a first redistribution layer 142a disposed on the first insulation layer 141a, and a second insulation layer 141b disposed on the first insulation layer 141a and covering the first redistribution layer 142a. The first redistribution layer 142a may have one or more openings 142ah. The openings 142ah may have a shape having a plurality of protrusions P, respectively. For example, the openings 142ah may have a cross shape, respectively. The openings 142ah may be filled with the second insulation layer 141b, respectively. When A refers to a thickness of the first redistribution layer 142a and B refers to a thickness of a region of the second insulation layer 141b covering the first redistribution layer 142a, B/A may be 1.5 or less.

As described above, in a vacuum lamination method used in the printed circuit board manufacturing process, since an insulation layer may be transferred to a substrate through the vacuum lamination method to form an insulation layer, it is possible to effectively cope with the thickness deviation by position. However, there may be defects due to foreign matter generated during a film cutting process, and there maybe a high possibility of void occurrence due to insufficient filling of the insulation layer. In particular, since this film type insulation layer may usually be a non-photosensitive insulation layer, there may be a limit to the fine pitch of the redistribution layer and the connection via. In the field of semiconductor packaging technology in which a fine design is required, a method of coating a liquid insulating material on a substrate may generally be applied as a process of forming an insulation layer for forming a redistribution layer. For example, liquid photo-imageable dielectric (PID) may be used as an insulation material.

In the semiconductor package process, an opening such as a degassing hole may be formed in the redistribution layer. In this case, since different insulation layers may physically contact each other through the opening, interlayer adhesion may be improved. Further, it is possible to easily discharge degassing component discharged from a lower insulation layer externally. When a coating method is applied as a process of forming an insulation layer for forming a redistribution layer, since the coating method proceeds in accordance with the pattern shape, a difference in thicknesses between an insulation layer in a region covering a pattern already formed on a substrate, and an insulation layer in a region covering an opening such as a degassing hole, that is, an undulation phenomenon, may occur. When such an undulation phenomenon is severe, there may be a problem in insulation reliability, and, for example, damage may occur to a circuit of the redistribution layer formed on the insulation layer having the undulation phenomenon. For example, a pattern in a layer disposed in a relatively upper portion may be damaged due to the difference, or plating liquid may be passed through between an insulation layer and a dry film resist to occur a short defect, due to a reduction in adhesion between the insulation layer and the dry film resist.

In a semiconductor package 100A according to an example, one or more openings 142ah may be formed in a first redistribution layer 142a. The openings 142ah may have a plurality of protrusions P, not simply in a circular or quadrangular shape. For example, the openings 142ah may have a cross shape, respectively. In this case, the problem caused by the above-described undulation phenomenon may be relatively minimized, comparing to a case in which the openings are simply formed in a circular or quadrangular shape. For example, when a second redistribution layer 142b is formed on a second insulation layer 141b covering the opening 142ah, it is expected that a concave surface of a portion in which the undulation phenomenon occurs will serve as a convex mirror, due to the opening 142ah of the second insulation layer 141b, which may usually be a photosensitive insulation layer. Therefore, an energy overlap phenomenon may occur on such a surface. The dry film for forming the second redistribution layer 142b may be cured in accordance with the energy overlap phenomenon. In this case, the circular opening maximizes the energy overlap phenomenon, and the quadrangular opening may not sufficiently reduce the energy overlap phenomenon, which does not sufficiently improve a mouse bite phenomenon. Alternatively, the opening 142ah having the plurality of protrusions P described above, for example, the cross-shaped opening 142ah may minimize the energy overlap phenomenon, and may sufficiently improve the mouse bite phenomenon, and the like. The opening 142*ah* may be formed in a ground pattern of the first redistribution layer 142*a*, but is not limited thereto.

In a semiconductor package 100A according to an example, when A refers to a thickness of a first redistribution layer 142*a* and B refers to a thickness of a region of a second insulation layer 141*b* covering the first redistribution layer 142*a*, B/A may be 1.5 or less. For example, B/A may be about 0.5 to 1.5. B/A may be 1.4 or less, or 1.2 or less, for example, about 0.5 to 1.4, or about 0.5 to 1.2. Further, the thickness A of the first redistribution layer 142*a* is 10 μm or less. For example, the thickness A of the first redistribution layer 142*a* is about 1 μm to 10 μm. When thinning and fine design of a connection structure 140 are further required, the thickness A of the first redistribution layer 142*a* is 7 μm or less, for example, about 1 μm to 7 μm. In addition, first and second insulation layers 141*a* and 141*b* may be photosensitive insulation layers, respectively. Even under such a condition, for example, under an extremely severe condition required for fine designing of the connection structure 140, the first redistribution layer 142*a* may be have a shape having a plurality of protrusions P, for example, a cross-shaped opening 142*ah*, to sufficiently improve the above-described mouse bite phenomenon or the like.

A semiconductor package 100A according to an example may further include a second redistribution layer 142*b* disposed on the second insulation layer 141*b*. The second redistribution layer 142*b* may include one or more wiring patterns 142*bw* in which at least a portion thereof respectively overlaps the openings 142*ah*, in plan view. In this case, widths of the wiring patterns 142*bw* may be 10 μm or less, for example, about 1 μm to 10 μm, respectively. As described above, even under such a condition, for example, under an extremely severe condition required for fine designing of the connection structure 140, the first redistribution layer 142*a* may have a shape having a plurality of protrusions P, for example, a cross-shaped opening 142*ah*, to sufficiently improve the above-described mouse bite phenomenon or the like.

Hereinafter, each configuration included in a semiconductor package 100A according to an example will be described in more detail.

The frame 110 may further improve rigidity of the semiconductor package 100A according to a specific material of the build-up layers 111*a* and 111*b*, and play a role of ensuring thickness uniformity of the encapsulant 130. The frame 110 may have a through-hole 110H passing through the build-up layers 111*a* and 111*b*. The semiconductor chip 120 may be disposed in the through-hole 110H, and passive components (not illustrated) may be disposed together as necessary. The through-hole 110H may have a wall surface surrounding the semiconductor chip 120, but the present disclosure is not limited thereto. The frame 110 may include wiring layers 112*a*, 112*b*, and 112*c* and wiring vias 113*a* and 113*b*, in addition to the build-up layers 111*a* and 111*b*, and thus may function as a connection structure. In this case, the wiring layers 112*a*, 112*b*, and 112*c* and the wiring vias 113*a* and 113*b* may function as electrical connection members. A connection structure having an electrical connection member capable of providing another type of vertical electrical connection path in place of the frame 110 may be disposed, as necessary.

The frame 110 may include a first build-up layer 111*a* in contact with the connection structure 140, a first wiring layer 112*a* in contact with the connection structure 140 and embedded in the first build-up layer 111*a*, a second wiring layer 112*b* disposed a side of the first build-up layer 111*a* opposite to a side in which the first wiring layer 112*a* is embedded, a second build-up layer 111*b* disposed on the first build-up layer 111*a* and covering at least a portion of the second wiring layer 112*b*, and a third wiring layer 112*c* disposed on a side of the second build-up layer 111*b* opposite to a side in which the second wiring layer 112*b* is embedded. The first and second wiring layers 112*a* and 112*b* and the second and third wiring layers 112*b* and 112*c* may be electrically connected to each other, respectively, through first and second wiring vias 113*a* and 113*b* passing through the first and second build-up layers 111*a* and 111*b*. The first to third wiring layers 112*a*, 112*b*, and 112*c* may be electrically connected to a connection pad 122 through first and/or second redistribution layers 142*a* and/or 142*b* of a connection structure 140.

A material of the build-up layers 111*a* and 111*b* is not particularly limited. For example, an insulating material may be used. As the insulating material, a thermosetting resin such as an epoxy resin, a thermoplastic resin such as polyimide, or a resin in which these resins are mixed with an inorganic filler, for example, ABF (Ajinomoto Build-up Film), or the like, may be used. Alternatively, a material in which a thermosetting resin or a thermoplastic resin is impregnated in, a core material such as glass fiber, glass cloth, glass fabric, or the like, together with an inorganic filler may be used, for example, a prepreg, or the like.

The wiring layers 112*a*, 112*b*, and 112*c* together with the wiring vias 113*a* and 113*b* may provide a vertical electrical connection path for the package, and may perform the role of redistributing the connection pad 122. As a material for forming the wiring layers 112*a*, 112*b*, and 112*c*, a metal material such as copper (Cu), aluminum (Al), silver (Ag), tin (Sn), gold (Au), nickel (Ni), lead (Pb), titanium (Ti), or alloys thereof may be used. The wiring layers 112*a*, 112*b*, and 112*c* may perform various functions, depending on a desired design of the layer. For example, a ground (GND) pattern, a power (PWR) pattern, a signal (S) pattern, and the like, may be included. The ground (GND) pattern and the power (PWR) pattern may be the same pattern, as necessary. Here, the signal (S) pattern may include various signal patterns except for aground (GND) pattern, a power (PWR) pattern, and the like, for example, a data signal pattern and the like. Further, via pads, electrical connection pads, and the like may be included. The wiring layers 112*a*, 112*b*, and 112*c* may be formed by a known plating process, and may be composed of a seed layer and a conductor layer, respectively.

A thickness of each of the wiring layers 112*a*, 112*b*, and 112*c* may be thicker than a thickness of each of the redistribution layers 142*a* and 142*b*. For example, the frame 110 may have a thickness equal to or greater than a thickness of the semiconductor chip 120. In order to maintain rigidity, prepregs and the like may be selected as the material of the build-up layers 111*a* and 111*b*, and the wiring layers 112*a*, 112*b*, and 112*c* may be relatively thick. The connection structure 140 may require a microcircuit and a high-density design. Therefore, a PID or the like may be selected as the material of the insulation layers 141*a* and 141*b*, and the redistribution layers 142*a* and 142*b* obtained therefrom may be relatively thin.

The first wiring layer 112*a* may be recessed into the first build-up layer 111*a*. In this way, in a case which the first wiring layer 112*a* is recessed into the first build-up layer 111*a* to have a step difference between a surface of the first build-up layer 111*a* in contact with the connection structure 140 and a surface of the first wiring layer 112*a* in contact with the connection structure 140, when the semiconductor chip 120 and the frame 110 are encapsulated with the encapsulant 130, the forming material may be prevented from bleeding to contaminate the first wiring layer 112a.

The wiring vias 113a and 113b electrically connect the wiring layers 112a, 112b, and 112c formed in different layers, thereby forming an electrical path in the frame 110. As the material for forming the wiring vias 113a and 113b, a metal material, such as copper (Cu), aluminum (Al), silver (Ag), tin (Sn), gold (Au), nickel (Ni), lead (Pb), titanium (Ti), or alloys thereof, may be used. The wiring vias 113a and 113b may also be a filled type via filled with a metal material, respectively, or may be a conformal type via in which a metal material is formed along a wall surface of a via hole. Further, the wiring vias 113a and 113b may each have a tapered shape. The wiring vias 113a and 113b may be also be formed by a plating process, and may be composed of a seed layer and a conductor layer.

A portion of the pads of the first wiring layer 112a may serve as a stopper, when a hole for the first wiring via 113a is formed. The first wiring via 113a may have a tapered shape in which the width of the upper surface thereof is wider than the width of the lower surface thereof in terms of the process. In this case, the first wiring via 113a may be integrated with the pad pattern of the second wiring layer 112b. When a hole for the second wiring via 113b is formed, a portion of the pads of the second wiring layer 112b may serve as stoppers. The second wiring via 113b may have a tapered shape in which the width of the upper surface thereof is wider than the width of the lower surface thereof in terms of the process. In this case, the second wiring via 113b may be integrated with the pad pattern of the third wiring layer 112c.

Although not illustrated in the drawing, a metal layer (not illustrated) may be disposed on a wall surface of the through-hole 110H of the frame 110 for the purpose of shielding electromagnetic waves or for dissipating heat as required, the metal layer (not illustrated) may surround the semiconductor chip 120.

The semiconductor chip 120 maybe an integrated circuit (IC) in which hundreds to millions of devices are integrated into a single chip. In this case, the integrated circuit may be an application processor chip, such as a central processor (e.g., CPU), a graphics processor (e.g., GPU), a digital signal processor, a cryptographic processor, a microprocessor, and the like, but is not limited thereto; may be a power management IC (PMIC); or may be a memory chip such as a volatile memory (for example, a dynamic random access memory (DRAM)), anon-volatile memory (for example, a read only memory (ROM)), a flash memory, or the like; or may be a logic chip such as an analog-to-digital converter, an application-specific IC (ASIC), or the like.

The semiconductor chip 120 maybe an integrated circuit in a bare state in which no separate bump or wiring layer is formed. The present disclosure is not limited thereto, and may be a packaged type integrated circuit, as needed. The integrated circuit may be formed based on an active wafer. In this case, silicon (Si), germanium (Ge), gallium arsenide (GaAs), or the like may be used as a base material of a body 121 of the semiconductor chip 120. Various circuits may be formed in the body 121. The connection pad 122 may be used to electrically connect the semiconductor chip 120 to other components, and metal materials such as aluminum (Al), or the like, may be used as formation materials thereof without any particular limitation. A passivation film 123 exposing the connection pad 122 may be formed on the body 121. The passivation film 123 may be an oxide film, a nitride film, or the like, or may be a double layer of an oxide film and a nitride film. An insulation film (not illustrated) or the like may be further disposed in other necessary positions. In the semiconductor chip 120, a surface on which the connection pad 122 is disposed may become an active surface, and a surface opposite thereto may become an inactive surface. In this case, when the passivation film 123 is formed on the active surface of the semiconductor chip 120, the active surface of the semiconductor chip 120 may determine a positional relationship based on the lowermost surface of the passivation film 123.

The encapsulant 130 may encapsulate the frame 110 and the semiconductor chip 120, and may also fill at least a portion of the through-hole 110H. The encapsulant 130 may include an insulating material. Examples of the insulating material may include for example a thermosetting resin such as an epoxy resin, a thermoplastic resin such as polyimide, or a resin including a thermosetting resin or a thermoplastic resin with a reinforcing material such as an inorganic filler, specifically, ABF, FR-4, BT resin, etc. In addition, a known molding material such as EMC may be used. Further, a photosensitive material, for example, a photo imageable encapsulant (PIE) may be used as needed. A material in which insulating resin such as a thermosetting resin or a thermoplastic resin is impregnated with a core material such as an inorganic filler and/or glass fiber, glass cloth, glass fabric, or the like, may be used, as needed.

The connection structure 140 may redistribute the connection pad 122 of the semiconductor chip 120. The connection pads 122 of several tens to hundreds of semiconductor chips 120 having various functions may be redistributed through the connection structure 140. The connection pads 122 may be physically and/or electrically connected externally, in accordance with functions thereof, through the electrical connection metal 170. The connection structure 140 may include a first insulation layer 141a, a first redistribution layer 142a disposed on the first insulation layer 141a, a first connection via 143a passing through the first insulation layer 141a and electrically connecting a connection pad 122 and the first redistribution layer 142a, a second insulation layer 141b disposed on the first insulation layer 141a and covering the first redistribution layer 142a, a second redistribution layer 142b disposed on the second insulation layer 141b, and a second connection via 143b passing through the second insulation layer 141b and electrically connecting the first and second redistribution layers 142a and 142b. These components may be more or less than those illustrated in the drawings.

As the material of the insulation layers 141a and 141b, an insulating material may be used. In this case, a photoimageable dielectric material (PID) may be used as an insulating material. In this case, a fine pitch may be introduced through the photolithography-via process. Tens to millions of the connection pads 122 in the semiconductor chip 120 may be redistributed very effectively as in the conventional case. The insulation layers 141a and 141b may be bounded to each other, and the boundaries may be unclear.

The redistribution layers 142a and 142b may be redistributed to electrically connect the connection pad 122 of the semiconductor chip 120 to the electrical connection metal 170. As a material for forming the redistribution layers 142a and 142b, a metal material such as copper (Cu), aluminum (Al), silver (Ag), tin (Sn), gold (Au), nickel (Ni), lead (Pb), titanium (Ti), or alloys thereof may be used. The redistribution layers 142a and 142b may also perform various functions, depending on a desired design. For example, a ground (GND) pattern, a power (PWR) pattern, a signal (S)

pattern, and the like, may be included. The ground (GND) pattern and the power (PWR) pattern may be the same pattern, as necessary. In this case, the signal (S) pattern may include various signal patterns except for a ground (GND) pattern, a power (PWR) pattern, and the like, for example, a data signal pattern and the like. Also, via pads, electrical connection metal pads, or the like may be included.

The connection vias 143a and 143b may electrically connect the redistribution layers 142a and 142b formed on different layers, and may electrically connect the connection pad 122 of the semiconductor chip 120 and the first redistribution layer 142a. The connection via 143a and 143b may be in physical contact with the connection pad 122, when the semiconductor chip 120 is a bare die. As the material for forming the connection via 143a and 143b, a metal material, such as copper (Cu), aluminum (Al), silver (Ag), tin (Sn), gold (Au), nickel (Ni), lead (Pb), titanium (Ti), or alloys thereof may be used. The connection via 143a and 143b may also be a filled type via filled with a metal material, or may be a conformal type via in which a metal material is formed along a wall surface of a via hole. Further, they may have a tapered shape in a direction, opposite to those of the wiring vias 113a and 113b, respectively. The connection vias 143a and 143b may also be formed using a plating process, and may be composed of a seed layer and a conductor layer.

The passivation layer 150 may be an additional structure for protecting the connection structure 140 from external physical or chemical damage, or the like. The passivation layer 150 may include a thermosetting resin. For example, the passivation layer 150 may be ABF, but is not limited thereto. The passivation layer 150 may have openings for opening at least a portion of the second redistribution layer 142b. The number of openings may be in the range of tens to tens of thousands, or more or less.

The under-bump metal 160 may also be an additional structure, which improves the connection reliability of the electrical connection metal 170, and thus improve the board level reliability of a semiconductor package 100A according to one example. The under-bump metal 160 may be provided as the number of tens to tens of thousands, or more or less. Each under-bump metal 160 may be electrically connected to the second redistribution layer 142b exposed by the opening. The under-bump metal 160 may be formed by a known metallization method using a known conductive material, for example, metal, but is not limited thereto.

The electrical connection metal 170 may also be an additional structure, which physically and/or electrically connects a semiconductor package 100A externally. For example, the semiconductor package 100A may be mounted on the main board of the electronic device through the electrical connection metal 170. The electrical connection metal 170 may be composed of a low melting point metal, for example, tin (Sn), or an alloy including tin (Sn). More specifically, it may be formed of a solder or the like, but this may be merely an example, and the material is not particularly limited thereto.

The electrical connection metal 170 may be a land, a solder ball, a pin, or the like. The electrical connection metal 170 may be formed of multiple layers or a single layer. In a case of being formed of multiple layers, it may include a copper pillar and a solder. In a case of being formed of a single layer, tin-silver solder or copper may be included, but this may be merely an example and the present disclosure is not limited thereto. The number, interval, arrangement type, etc., of the electrical connection metal 170 are not particularly limited, and may be sufficiently modified, depending on a design specification by a skilled artisan. For example, the number of electrical connection metal 170 may be in the range of tens to thousands, depending on the number of connection pads 122, and may be more or less than the above range.

At least one of the electrical connection metal 170 may be disposed in a fan-out area. The fan-out area may be an area, except for those in which the semiconductor chip 120 is disposed. The fan-out package may be more reliable than the fan-in package, may have many I/O terminals, and may facilitate 3D interconnection. In addition, a package thinner than a ball grid array (BGA) package, a land grid array (LGA) package, and the like, may be manufactured, and may be excellent in price competitiveness.

Figure 12:
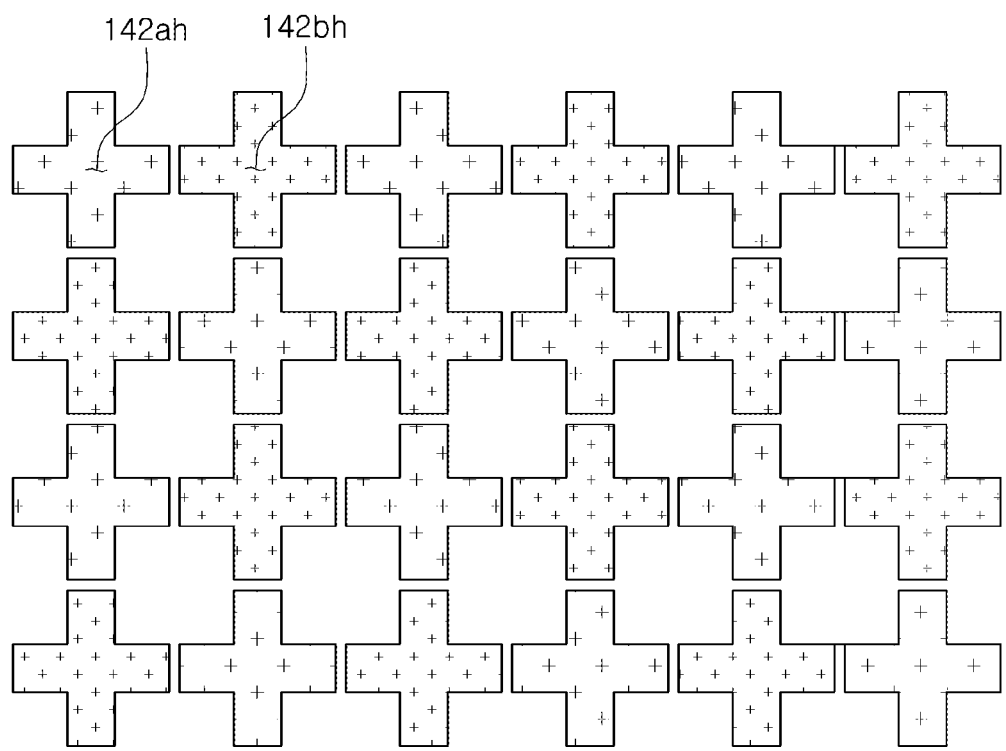
FIG. 12 is a schematic plan view illustrating an arrangement of cross-shaped openings of the first and second redistribution layers in FIG. 9.

FIG. 12 is a schematic plan view illustrating an arrangement of cross-shaped openings of the first and second redistribution layers in FIG. 9.

Referring to the drawings, in a semiconductor package 100A according to an example, not only a first redistribution layer 142a have an opening 142ah but also a second redistribution layer 142b may have an opening 142bh. In this case, it is preferable that the first opening 142ah and the second opening 142bh may be arranged not to overlap each other in a plane. When the first and second openings 142ah and 142bh overlap each other, occurrence of undulation may be further increased to further form a third insulation layer (not illustrated) on the second redistribution layer 142b. Further, when a third redistribution layer (not illustrated) is further formed on the third insulation layer (not illustrated), risk of circuit damage of the third redistribution layer (not illustrated) may be further increased. The first and second openings 142ah and 142bh may be formed in the ground pattern of the first and second redistribution layers 142a and 142b, respectively, which may correspond to the pattern shown in FIG. 12, but is not limited thereto. Here, the one or more of the plurality of first openings 142ah penetrate through one continuous pattern of the first redistribution layer 142a, one or more of the plurality of second openings 142bh penetrate through one continuous pattern of second redistribution layer 142b.

Figure 13:
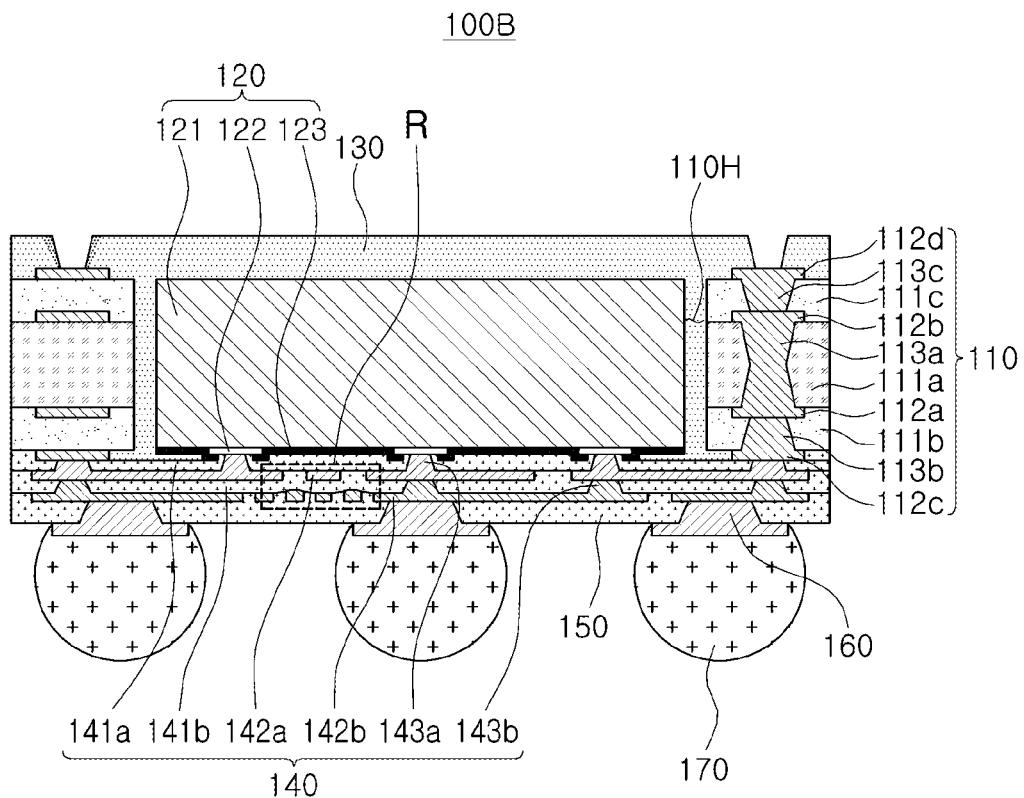
FIG. 13 is a schematic cross-sectional view illustrating another example of a semiconductor package.

FIG. 13 is a schematic cross-sectional view illustrating another example of a semiconductor package.

Referring to the drawings, a semiconductor package 100B according to another example may have a configuration different from those of the frame 110 in the semiconductor package 100A according to the above-described example. For example, the frame 110 may include a core layer 111a, first and second wiring layers 112a and 112b respectively disposed on both surfaces of the core layer 111a, first and second build-up layers 111b and 111c respectively disposed on both surfaces of the core layer 111a and respectively covering the first and second wiring layers 112a and 112b, a third wiring layer 112c disposed on a side of the first build-up layer 111b, opposite to a side in which the first wiring layer 112a is embedded, a fourth wiring layer 112d disposed on a side of the second build-up layer 111c, opposite to a side in which the second wiring layer 112b is embedded, a first wiring via 113a passing through the core layer 111a and electrically connecting the first and second wiring layers 112a and 112b, a second wiring via 113b passing through the first build-up layer 111b and electrically connecting the first and third wiring layers 112a and 112c, and a third wiring via 113c passing through the second build-up layer 111c and electrically connecting the second and fourth wiring layers 112b and 112d. Since the frame 110 has a larger number of wiring layers 112a, 112b, 112c, and 112d, the connection structure 140 may be further simplified.

The core layer 111a may be thicker than the first build-up layer 111b and the second build-up layer 111c. The core layer 111a may be relatively thick to maintain rigidity, and the first build-up layer 111b and the second build-up layer 111c may be introduced to form a larger number of wiring layers. In a similar manner, the first wiring vias 113a passing through the core layer 111a may be greater in height and diameter than the second and third wiring vias 113b and 113c passing through the second and third build-up layers 111b and 111c. Further, the first wiring via 113a may have an hourglass or cylindrical shape, while the second and third wiring vias 113b and 113c may have tapered shapes opposite to each other. The thickness of each of the wiring layers 112a, 112b, 112c, and 112d may be thicker than the thickness of each of the redistribution layers 142a and 142b.

A semiconductor package 100B according to another example may also introduce a design for the undulation control into a connection structure 140, and the other details including a description of region R of the connection structure 140 may be substantially the same as those of the semiconductor package 100A according to the above-described example, and a detailed description thereof will be omitted.

EXPERIMENTAL EXAMPLE

Figure 14:
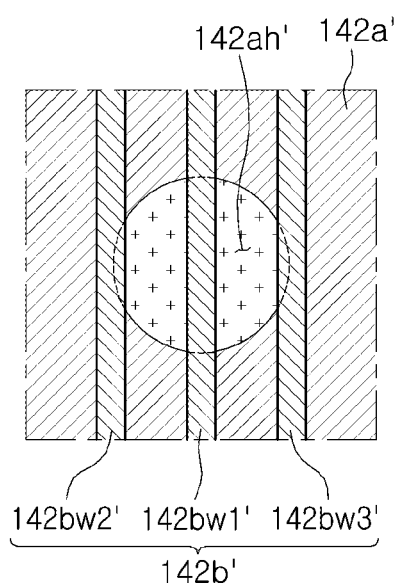
FIG. 14 is a schematic plan view illustrating a case in which a first redistribution layer has a circular opening and a second redistribution layer has a plurality of wiring patterns.
Figure 14:
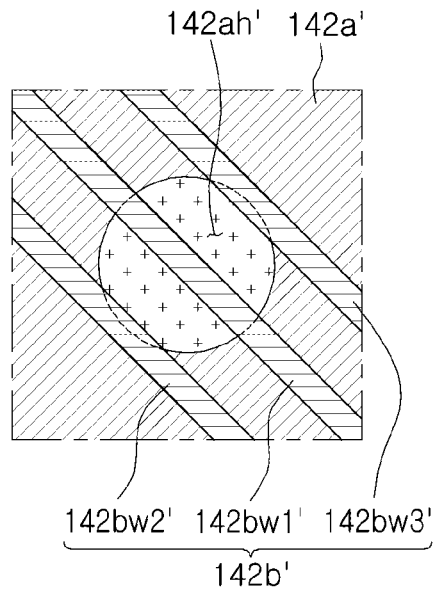

FIG. 14 is a schematic plan view illustrating a case in which a first redistribution layer has a circular opening and a second redistribution layer has a plurality of wiring patterns. A wiring pattern refers to a pattern having a width in a line width direction thereof smaller than a length in a lengthwise thereof, in plan view. The lengthwise direction may refers to a direction along which the wiring pattern extends and the line width direction may refers to a direction perpendicular to the lengthwise direction, in plan view.

First, in region R of the above-described semiconductor packages 100A and 100B, a circular opening 142ah' was formed in a first redistribution layer 142a'. Then, a second redistribution layer 142b', including first to third wiring patterns 142bw1', 142bw2', and 142bw3' arranged in such a manner that at least a portion thereof respectively overlaps the circular opening 142ah', in plan view, was formed on the circular opening 142ah', as illustrated in (a) and (b) of FIG. 14. Next, after determining whether circuit damage of the first to third wiring patterns 142bw1', 142bw2', and 142bw3', particularly circuit damage of the first wiring pattern 142bw1' under changes of various conditions occurs, results therefrom were illustrated in Table 1 below. In the following Table 1, A refers to a thickness (unit: μm) of the first redistribution layer 142a', B refers to a thickness (unit: μm) of a region of a second insulation layer (not illustrated) covering the first redistribution layer 142a', C refers to a line width (unit: μm) of the first wiring pattern 142bw1', D refers to a diameter (unit: μm) of the opening 142ah', OK refers to no circuit damage, and NG refers to a case in which circuit damage occurred.

TABLE 1

| Experimental Example No. | A | B | C | B/A | (a) of FIG. 14 | | | | (b) of FIG. 14 | | | |
|---|---|---|---|---|---|---|---|---|---|---|---|---|
| | | | | | D 15 | D 25 | D 35 | D 45 | D 15 | D 25 | D 35 | D 45 |
| 1 | 5 | 6 | 7 | 1.20 | NG | NG | NG | NG | NG | NG | NG | NG |
| 2 | 5 | 10 | 7 | 2.00 | OK | OK | OK | OK | OK | OK | OK | OK |
| 3 | 7 | 10 | 7 | 1.43 | NG | NG | NG | NG | NG | NG | NG | NG |
| 4 | 5 | 6 | 10 | 1.20 | NG | NG | NG | NG | NG | NG | NG | NG |
| 5 | 5 | 10 | 10 | 2.00 | OK | OK | OK | OK | OK | OK | OK | OK |
| 6 | 7 | 10 | 10 | 1.43 | NG | NG | NG | NG | NG | NG | NG | NG |

As can be seen from Table 1, in a case in which the opening 142ah' was circular, only when B/A was 2.0 or more, a thickness of the second insulation layer (not illustrated) was considerable not to occur undulation, circuit damage did not occur. When A was 10 μm or less and B/A was 1.5 or less (a condition requiring a fine design), circuit damage occurred.

Figure 15:
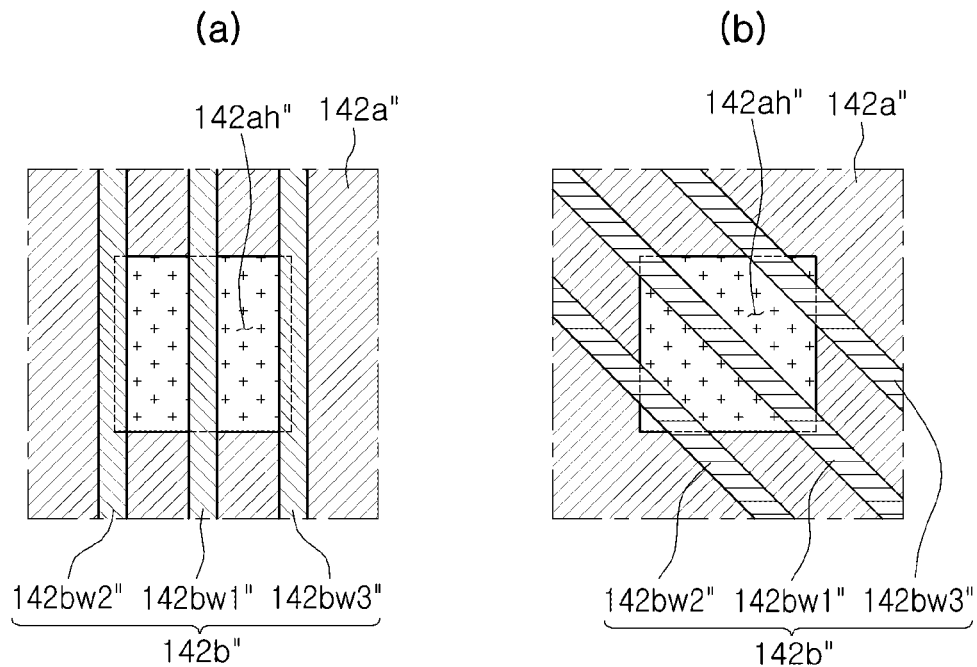
FIG. 15 is a schematic plan view illustrating a case in which a first redistribution layer has a quadrangular opening and a second redistribution layer has a plurality of wiring patterns.

FIG. 15 is a schematic plan view illustrating a case in which a first redistribution layer has a quadrangular opening and a second redistribution layer has a plurality of wiring patterns.

Next, in region R of the above-described semiconductor packages 100A and 100B, a quadrangular opening 142ah" was formed in a first redistribution layer 142a". Then, a second redistribution layer 142b", including first to third wiring patterns 142bw1", 142bw2", and 142bw3" arranged in such a manner that at least a portion thereof respectively overlaps the quadrangular opening 142ah", in plan view, was formed on the quadrangular opening 142ah", as illustrated in (a) and (b) of FIG. 15. Next, after determining whether circuit damage of the first to third wiring patterns 142bw1", 142bw2", and 142bw3", particularly circuit damage of the first wiring pattern 142bw1" under changes of various conditions occurs, results therefrom were illustrated in Table 2 below. In the following Table 2, A refers to a thickness (unit: μm) of the first redistribution layer 142a", B refers to a thickness (unit: μm) of a region of a second insulation layer (not illustrated) covering the first redistribution layer 142a", C refers to a line width (unit: μm) of the first wiring pattern 142bw1", D refers to a length (unit: μm) of a side of the opening 142ah", and OK and NG refer to whether circuit damage occurred, as described above. In a case of shown in FIG. 15, the openings 142ah" are square openings.

TABLE 2

| Experimental Example No. | A | B | C | B/A | (a) of FIG. 15 | | | | (b) of FIG. 15 | | | |
|---|---|---|---|---|---|---|---|---|---|---|---|---|
| | | | | | D 15 | D 25 | D 35 | D 45 | D 15 | D 25 | D 35 | D 45 |
| 7 | 5 | 6 | 7 | 1.20 | NG | NG | NG | NG | NG | NG | NG | NG |
| 8 | 5 | 10 | 7 | 2.00 | OK | OK | OK | OK | OK | OK | OK | OK |
| 9 | 7 | 10 | 7 | 1.43 | OK | OK | OK | OK | NG | NG | NG | NG |
| 10 | 5 | 6 | 10 | 1.20 | NG | NG | NG | NG | NG | NG | NG | NG |
| 11 | 5 | 10 | 10 | 2.00 | OK | OK | OK | OK | OK | OK | OK | OK |
| 12 | 7 | 10 | 10 | 1.43 | OK | OK | OK | OK | NG | NG | NG | NG |

As can be seen from the above Table 2, in a case in which the opening 142ah" was quadrangular, only when B/A was 2.0 or more, a thickness of the second insulation layer (not illustrated) was considerable not to occur undulation, circuit damage did not occur. In a case in which the first to third wiring patterns 142bw1", 142bw2", and 142bw3" were arranged in a specific arrangement, for example, were inclined, as illustrated in (b) of FIG. 15, when A was 10 μm or less and B/A was 1.5 or less, circuit damage was prevented from being occurred to some extent. It can be seen that, in a case of a very tight condition, for example, when A was 10 µm or less and B/A was 1.4 or less, or even 1.2 or less, circuit damage occurred in the same manner as those of in the circular case. Therefore, it can be seen that there is a limit to improving the circuit damage even in a quadrangular shape.

Figure 16:
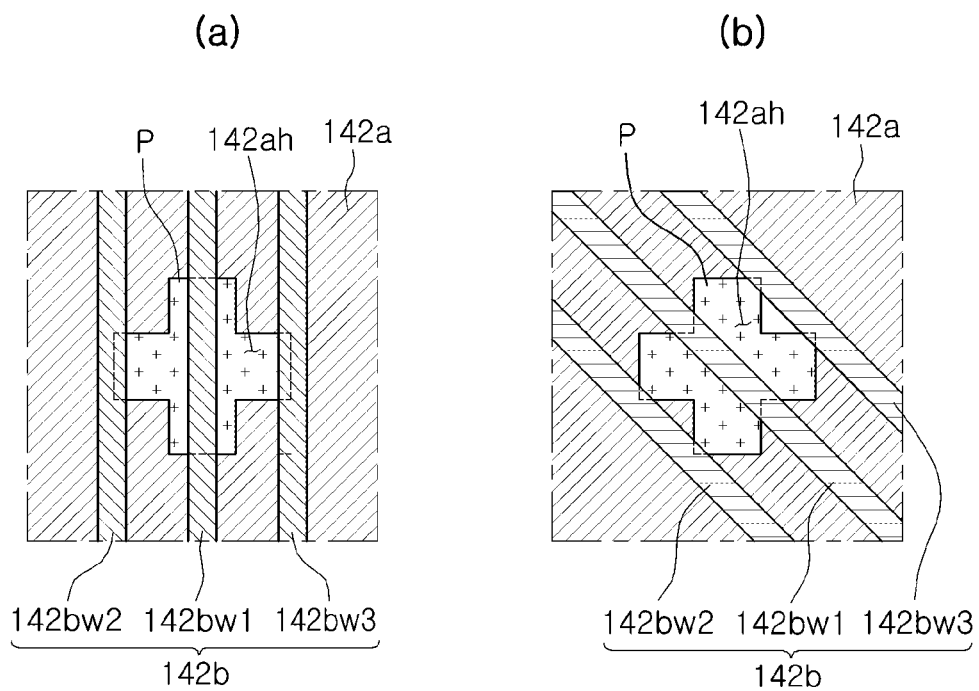
FIG. 16 is a schematic plan view illustrating a case in which a first redistribution layer has a cross-shaped opening and a second redistribution layer has a plurality of wiring patterns.

FIG. 16 is a schematic plan view illustrating a case in which a first redistribution layer has a cross-shaped opening and a second redistribution layer has a plurality of wiring patterns.

Next, in region R of the above-described semiconductor packages 100A and 100B, a cross-shaped opening 142*ah* was formed in a first redistribution layer 142*a*. Then, a second redistribution layer 142*b*, including first to third wiring patterns 142*bw*1, 142*bw*2, and 142*bw*3 arranged in such a manner that at least a portion thereof respectively overlaps the cross-shaped opening 142*ah*, in plan view, was formed on the cross-shaped opening 142*ah*, as illustrated in (a) and (b) of FIG. 16. Next, after determining whether circuit damage of the first to third wiring patterns 142*bw*1, 142*bw*2, and 142*bw*3, particularly circuit damage of the first wiring pattern 142*bw*1 under changes of various conditions occurs, results therefrom were illustrated in Table 3 below. In the following Table 3, A refers to a thickness (unit: µm) of the first redistribution layer 142*a*, B refers to a thickness (unit: µm) of a region of a second insulation layer (not illustrated) covering the first redistribution layer 142*a*, C refers to a line width (unit: µm) of the first wiring pattern 142*bw*1, D refers to a distance (unit: µm) between ends of opposing protrusions P disposed on opposite sides of a center of the opening 142*ah*, and OK and NG refer to whether circuit damage occurred, as described above. In the case shown in FIG. 16, the distance between the ends of the opposing protrusions P provided on the opposite sides of the center of the opening 142*ah* is equal.

TABLE 3

| | | | | (a) of FIG. 16 | | | | (b) of FIG. 16 | | | |
|---|---|---|---|---|---|---|---|---|---|---|---|
| Experimental | | | | D | D | D | D | D | D | D | D |
| Example No. | A | B | C | B/A | 15 | 25 | 35 | 45 | 15 | 25 | 35 | 45 |
| 13 | 5 | 6 | 7 | 1.20 | OK | OK | OK | OK | OK | OK | OK | OK |
| 14 | 5 | 10 | 7 | 2.00 | OK | OK | OK | OK | OK | OK | OK | OK |
| 15 | 7 | 10 | 7 | 1.43 | OK | OK | OK | OK | OK | OK | OK | OK |
| 16 | 5 | 6 | 10 | 1.20 | OK | OK | OK | OK | OK | OK | OK | OK |
| 17 | 5 | 10 | 10 | 2.00 | OK | OK | OK | OK | OK | OK | OK | OK |
| 18 | 7 | 10 | 10 | 1.43 | OK | OK | OK | OK | OK | OK | OK | OK |

As can be seen from Table 3, in a case in which the opening 142*ah* was cross-shaped, not only when B/A was 2.0 or more, but also when A was 10 µm or less and B/A was 1.5 or less, 1.4 or less, or even 1.2 or less, circuit damage was prevented from being occurred. It can be seen that, in a case of a very tight condition for thinning and fine design, the circuit damage may be improved regardless of arrangement of the first to third wiring patterns 142*bw*1, 142*bw*2, and 142*bw*3.

In this case, the second redistribution layer 142*b*, as illustrated in (a) of FIG. 16, may include: a first wiring pattern 142*bw*1 disposed such that at least portions thereof respectively overlap a center of the opening 142*ah* and end portions of at least two protrusions P among the plurality of protrusions P, in plan view; a second wiring pattern 142*bw*2 disposed on one side of the first wiring pattern 142*bw*1 and disposed such that at least a portion thereof overlaps an end portion of one protrusion P among the plurality of protrusions P, in plan view; and a third wiring pattern 142*bw*3 disposed on the other side of the first wiring pattern 142*bw*1 and disposed such that at least a portion thereof overlaps an end portion of the other protrusion P among the plurality of protrusions P, in plan view.

Further, the second redistribution layer 142*b*, as illustrated in (b) of FIG. 16, may include: a first wiring pattern 142*bw*1 disposed to overlap a center of the opening 142*ah* and to be spaced apart from end portions of the plurality of protrusions P, in plan view; a second wiring pattern 142*bw*2 disposed on one side of the first wiring pattern 142*bw*1 and disposed such that at least portions thereof respectively overlap end portions of two protrusions P among the plurality of protrusions P, in plan view; and a third wiring pattern 142*bw*3 disposed on the other side of the first wiring pattern 142*bw*1 and disposed such that at least portions thereof respectively overlap end portions of the other two protrusions P among the plurality of protrusions P, in plan view.

In the present disclosure, the words "lower", "lower portion", "lower surface", and the like are used to refer to the downward direction (in the vertical direction of the drawings, also referred to as the thickness direction) with respect to the cross section of the drawing for convenience, while the words "upper", "upper portion", "upper surface", and the like are used to refer to a direction opposite thereto. It should be understood that, the definitions referring to directions are for convenience of explanation, the scope of the claims is not particularly limited by the description of such directions, and the concepts of the upward/downward directions may be changed at any time.

The term of "connect" or "connection" in the present disclosure may be not only a direct connection, but also a concept including an indirect connection through an adhesive layer or the like. In addition, the term "electrically connected" or "electrical connection" is a concept including both a physical connection and a physical non-connection. Also, the expressions of "first," second," etc. are used to distinguish one component from another, and do not limit the order and/or importance of the components. In some cases, without departing from the spirit of the invention, the first component may be referred to as a second component, and similarly, the second component may be referred to as a first component.

The uses of the expression "an example embodiment" in the present disclosure do not all refer to the same embodiment, but may be provided for emphasizing and explaining different unique features. However, the above-mentioned example embodiments do not exclude that they are implemented in combination with the features of other example embodiments. For example, although the description in the specific example embodiment may be not described in another example embodiment, it may be understood as an explanation related to another example embodiment, unless otherwise described or contradicted by the other example embodiment.

The terms used in the present disclosure are used only to illustrate an example embodiment, and are not intended to limit the present disclosure. At this time, the singular expressions include plural expressions unless the context clearly dictates otherwise.

According to an example embodiment of the present disclosure, a semiconductor package which may sufficiently control the undulation may be provided, even when the opening is formed in the redistribution layer.

While examples have been illustrated and described above, it will be apparent to those skilled in the art that modifications and variations could be made without departing from the scope of the present disclosure as defined by the appended claims.

What is claimed is:

1. A semiconductor package comprising:
a semiconductor chip having a connection pad;
an encapsulant covering at least a portion of the semiconductor chip; and
a connection structure disposed on the semiconductor chip and the encapsulant,
wherein the connection structure comprises a first insulation layer, a first redistribution layer disposed on the first insulation layer, and a second insulation layer disposed on the first insulation layer and covering the first redistribution layer,
the first redistribution layer has one or more openings,
the openings have a shape having a plurality of protrusions, respectively, and
B/A is 1.5 or less, where A refers to a thickness of the first redistribution layer, and B refers to a thickness of a region of the second insulation layer covering the first redistribution layer.

2. The semiconductor package according to claim 1, wherein the B/A is 0.5 or more.

3. The semiconductor package according to claim 1, wherein the thickness of the first redistribution layer is 10 µm or less.

4. The semiconductor package according to claim 3, wherein the thickness of the first redistribution layer is 1 µm or more.

5. The semiconductor package according to claim 1, wherein the openings have a cross shape.

6. The semiconductor package according to claim 1, wherein the second insulation layer fills at least a portion of each of the openings.

7. The semiconductor package according to claim 1, wherein the first and second insulation layers are photosensitive insulation layers.

8. The semiconductor package according to claim 1,
wherein the connection structure further comprises a second redistribution layer disposed on the second insulation layer, and
wherein the second redistribution layer comprises one or more wiring patterns, wherein at least a portion thereof respectively overlap the openings, in a plan view.

9. The semiconductor package according to claim 8, wherein widths of the wiring patterns are 10 µm or less, respectively.

10. The semiconductor package according to claim 9, wherein widths of the wiring patterns are 1 µm or more, respectively.

11. The semiconductor package according to claim 8,
wherein the second redistribution layer, in the plan view, comprises:
a first wiring pattern having at least portions respectively overlapping a center of the opening and end portions of at least two protrusions among the plurality of protrusions;
a second wiring pattern disposed on one side of the first wiring pattern and having least a portion overlapping an end portion of one protrusion among the plurality of protrusions; and
a third wiring pattern disposed on the other side of the first wiring pattern and having at least a portion overlapping an end portion of the other protrusion among the plurality of protrusions.

12. The semiconductor package according to claim 8,
wherein the second redistribution layer, in the plan view, comprises:
a first wiring pattern overlapping a center of the opening and spaced apart from end portions of the plurality of protrusions;
a second wiring pattern disposed on one side of the first wiring pattern and having at least portions respectively overlapping end portions of two protrusions among the plurality of protrusions; and
a third wiring pattern disposed on the other side of the first wiring pattern and having at least portions respectively overlapping end portions of the other two protrusions among the plurality of protrusions.

13. The semiconductor package according to claim 1, further comprising a frame having a through-hole,
wherein the semiconductor chip is disposed in the through-hole, and
the encapsulant fills at least a portion of the through-hole.

14. The semiconductor package according to claim 13, wherein the frame comprises:
a first build-up layer in contact with the first insulation layer;
a first wiring layer in contact with the first insulation layer and embedded in the first build-up layer;
a second wiring layer disposed on a side of the first build-up layer, opposite to a side in which the first wiring layer is embedded;
a second build-up layer disposed on the first build-up layer and covering the second wiring layer; and
a third wiring layer disposed on a side of the second build-up layer, opposite to a side in which the second wiring layer is embedded, and
the first to third wiring layers are electrically connected to the connection pad.

15. The semiconductor package according to claim 13, wherein the frame comprises:
a core layer;
first and second wiring layers respectively disposed on both surfaces of the core layer;
first and second build-up layers respectively disposed on both surfaces of the core layer and respectively covering the first and second wiring layers;
a third wiring layer disposed on a side of the first build-up layer, opposite to a side in which the first wiring layer is embedded; and
a fourth wiring layer disposed on a side of the second build-up layer, opposite to a side in which the second wiring layer is embedded, and
wherein the first to fourth wiring layers are electrically connected to the connection pad.

16. The semiconductor package according to claim 1, wherein the one or more of the openings penetrate through one continuous pattern of the first redistribution layer.

17. A semiconductor package comprising:
a semiconductor chip having a connection pad;
an encapsulant covering at least a portion of the semiconductor chip; and
a connection structure disposed on the semiconductor chip and the encapsulant,
wherein the connection structure comprises a first insulation layer, a redistribution layer disposed on the first insulation layer, and a second insulation layer disposed on the first insulation layer and covering the redistribution layer,
the redistribution layer has a plurality of openings each having a cross shape, and
a thickness of the redistribution layer is 10 µm or less.

18. The semiconductor package according to claim 17, wherein one or more of the plurality of openings penetrate through one continuous pattern of the redistribution layer.

19. A semiconductor package comprising:
a semiconductor chip having a connection pad;
an encapsulant covering at least a portion of the semiconductor chip; and
a connection structure disposed on the semiconductor chip and the encapsulant,
wherein the connection structure comprises a first insulation layer, a first redistribution layer disposed on the first insulation layer, a second insulation layer disposed on the first insulation layer and covering the first redistribution layer, and a second redistribution layer disposed on the second insulation layer,
the first redistribution layer has a plurality of first openings each having a cross shape,
the second redistribution layer has a plurality of second openings each having a cross shape, and
in a plan view, the plurality of first openings and the plurality of second openings are spaced apart from each other.

20. The semiconductor package according to claim 19, wherein one or more of the plurality of first openings penetrate through one continuous pattern of the first redistribution layer,
one or more of the plurality of second openings penetrate through one continuous pattern of second redistribution layer, and
in the plan view, the one continuous pattern of the first redistribution layer and the one continuous pattern of the second redistribution layer at least partially overlap with each other.

* * * * *